(12) United States Patent
Wu et al.

(10) Patent No.: US 12,131,052 B2
(45) Date of Patent: Oct. 29, 2024

(54) STRIPE MANAGEMENT METHOD, STORAGE SYSTEM, STRIPE MANAGEMENT APPARATUS, AND STORAGE MEDIUM TO IMPROVE DATA STORAGE RELIABILITY

(71) Applicant: HUAWEI TECHNOLOGIES CO., LTD., Guangdong (CN)

(72) Inventors: Xiang Wu, Chengdu (CN); Xiaodong Luo, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/151,848

(22) Filed: Jan. 9, 2023

(65) Prior Publication Data

US 2023/0163789 A1    May 25, 2023

Related U.S. Application Data

(63) Continuation of application No. PCT/CN2021/105640, filed on Jul. 12, 2021.

(30) Foreign Application Priority Data

Jul. 10, 2020 (CN) ......................... 202010661972.0
Oct. 23, 2020 (CN) ......................... 202011148485.0

(51) Int. Cl.
*G06F 3/06* (2006.01)
*G06F 3/00* (2006.01)
(Continued)

(52) U.S. Cl.
CPC .......... *G06F 3/0652* (2013.01); *G06F 3/0619* (2013.01); *G06F 3/0647* (2013.01);
(Continued)

(58) Field of Classification Search
CPC .... G06F 3/0652; G06F 3/0619; G06F 3/0647; G06F 3/067; H03M 13/35; H03M 13/373
See application file for complete search history.

(56) References Cited

U.S. PATENT DOCUMENTS 10,048,999 B2 *   8/2018   Shu ..................... G06F 11/0793
10,142,419 B2 *  11/2018   Zhang .................... H04L 67/10
(Continued)

FOREIGN PATENT DOCUMENTS

CN    103577274 A    2/2014
CN    105630423 A    6/2016
(Continued)

OTHER PUBLICATIONS

Extended European Search Report in European Appln No. 21837389.2, dated Oct. 26, 2023, 7 pages.
(Continued)

*Primary Examiner* — Justin R Knapp
(74) *Attorney, Agent, or Firm* — Fish & Richardson P.C.

(57) ABSTRACT

The present disclosure relates to stripe management methods, storage systems, stripe management apparatuses, and storage mediums. In one example method, check units in a plurality of stripes are obtained. A first stripe of the plurality of stripes complies with a first erasure code ratio. A new check unit is generated based on the check units in the plurality of stripes. The new check unit and data units in the plurality of stripes belong to a new stripe, the new stripe complies with a second erasure code ratio, and a quantity of data units corresponding to the first erasure code ratio is less than a quantity of data units corresponding to the second erasure code ratio.

18 Claims, 7 Drawing Sheets

---

Cache data units and check units of a plurality of first stripes in a first medium layer based on a first erasure code ratio — 401

Persistently store the data units that are of the plurality of first stripes and that are cached in the first medium layer and a new check unit in a second medium layer based on a second erasure code ratio — 402

(51) Int. Cl.
    *H03M 13/00*    (2006.01)
    *H03M 13/35*    (2006.01)
    *H03M 13/37*    (2006.01)
(52) U.S. Cl.
    CPC ............ *G06F 3/067* (2013.01); *H03M 13/35* (2013.01); *H03M 13/373* (2013.01)

(56) References Cited

U.S. PATENT DOCUMENTS

| | | | |
|---|---|---|---|
| 10,218,789 B2* | 2/2019 | Yang | ...................... G11C 29/52 |
| 10,929,226 B1* | 2/2021 | Miller | .................. G06F 11/1076 |
| 11,153,037 B2* | 10/2021 | Shin | ...................... H03M 13/13 |
| 2015/0378820 A1 | 12/2015 | Doerner | |
| 2016/0211869 A1 | 7/2016 | Blaum et al. | |
| 2017/0228282 A1 | 8/2017 | Gupta et al. | |

FOREIGN PATENT DOCUMENTS

| | | | |
|---|---|---|---|
| CN | 106201766 | A | 12/2016 |
| CN | 107436733 | A | 12/2017 |
| CN | 109189326 | A | 1/2019 |
| CN | 110865901 | A | 3/2020 |
| WO | 2017173623 | A1 | 10/2017 |

OTHER PUBLICATIONS

International Search Report and Written Opinion in International Appln. No. PCT/CN2021/105640, mailed on Oct. 15, 2021, 17 pages (with English translation).

* cited by examiner

STRIPE MANAGEMENT METHOD, STORAGE SYSTEM, STRIPE MANAGEMENT APPARATUS, AND STORAGE MEDIUM TO IMPROVE DATA STORAGE RELIABILITY

CROSS-REFERENCE TO RELATED APPLICATIONS

This application is a continuation of International Application No. PCT/CN2021/105640, filed on Jul. 12, 2021, which claims priorities to Chinese Patent Application No. 202010661972.0, filed on Jul. 10, 2020 and Chinese Patent Application No. 202011148485.0, filed on Oct. 23, 2020. All of the aforementioned patent applications are hereby incorporated by reference in their entireties.

TECHNICAL FIELD

Embodiments of this application relate to the field of data storage technologies, and in particular, to a stripe management method, a storage system, a stripe management apparatus, and a storage medium.

BACKGROUND

In a storage system, improving an effective storage capacity is a powerful weapon for reducing storage costs, and an erasure code (EC) technology can improve the effective storage capacity of the storage system. Currently, the EC technology is widely applied to storage systems. The EC technology is mainly encoding data units by using an erasure code algorithm, to obtain a check unit, and storing the data units and the check unit together, to achieve fault tolerance. In the storage system, when the EC technology is used to reduce costs, during encoding, a larger quantity of data units indicates higher storage space utilization. However, when a quantity of data units is relatively large, it is relatively difficult to obtain a complete EC stripe, and therefore data storage reliability is affected.

SUMMARY

Embodiments of this application provide a stripe management method, a storage system, a stripe management apparatus, and a storage medium, to improve data storage reliability while improving storage space utilization of the storage system. The technical solutions are as follows.

According to a first aspect, a stripe management method is provided, applied to a storage system. The method includes:

obtaining check units in a plurality of first stripes, where the first stripe complies with a first erasure code ratio; and generating a new check unit based on the check units in the plurality of first stripes, where the new check unit and data units in the plurality of first stripes belong to a new stripe, the new stripe complies with a second erasure code ratio, and a quantity of data units corresponding to the first erasure code ratio is less than a quantity of data units corresponding to the second erasure code ratio. That is, first, a relatively small erasure code ratio is used to store data, and then, the relatively small erasure code ratio is converted into a relatively large erasure code ratio to store data. A complete stripe is easily obtained by using a relatively small erasure code ratio to store data, thereby alleviating write amplification, and improving storage space utilization. In addition, a proportion of redundant data in storage space can be reduced by using a relatively large erasure code ratio to store data, thereby improving storage space utilization. Therefore, data storage reliability is improved while storage space utilization of the storage system can be improved. In addition, the check unit in the new stripe is generated by using the check units in the plurality of first stripes, and the data units in the plurality of first stripes do not participate in an operation, thereby saving a computing resource.

In a case, a quantity of check units in the new stripe is the same as a quantity of check units in the first stripe.

In an implementation, the plurality of first stripes includes at least one first stripe that is not persistently stored in the storage system and at least one first stripe that is persistently stored in the storage system; and the obtaining check units in a plurality of first stripes specifically includes:

reading a check unit in the at least one first stripe that is persistently stored in the storage system; and reading a check unit in the at least one first stripe that is not persistently stored in the storage system.

Further, the method includes:

persistently storing data units in the at least one first stripe that is not persistently stored in the storage system and the new check unit.

In an implementation, the plurality of first stripes are first stripes that are not persistently stored in the storage system; and the method further includes:

persistently storing the data units in the plurality of first stripes and the new check unit.

According to a second aspect, a storage system is provided. The storage system includes one or more processors, and the one or more processors are configured to implement the stripe management method according to the first aspect.

The storage system provided in the second aspect may be a distributed storage system, or may be a centralized storage system.

According to a third aspect, a stripe management apparatus is provided. The stripe management apparatus is applied to a storage system, the stripe management apparatus includes a plurality of units, and the plurality of units are configured to implement the stripe management method according to the first aspect.

According to a fourth aspect, a computer-readable storage medium is provided.

The computer-readable storage medium includes computer program instructions, and one or more central processing units in a storage system execute the computer program instructions to enable the storage system to perform the stripe management method according to the first aspect.

According to a fifth aspect, a computer program product that includes instructions is provided, and when the computer program product runs on a computer, the computer is enabled to perform the stripe management method according to the first aspect.

Technical effects achieved in the second aspect, the third aspect, the fourth aspect, and the fifth aspect are similar to technical effects achieved by using corresponding technical means in the first aspect. Details are not described herein again.

DESCRIPTION OF EMBODIMENTS

To make the objectives, technical solutions and advantages of embodiments of this application clearer, the following further describes embodiments of this application in detail with reference to the accompanying drawings.

Before embodiments of this application are described in detail, a system architecture in embodiments of this application is described first.

Figure 1:
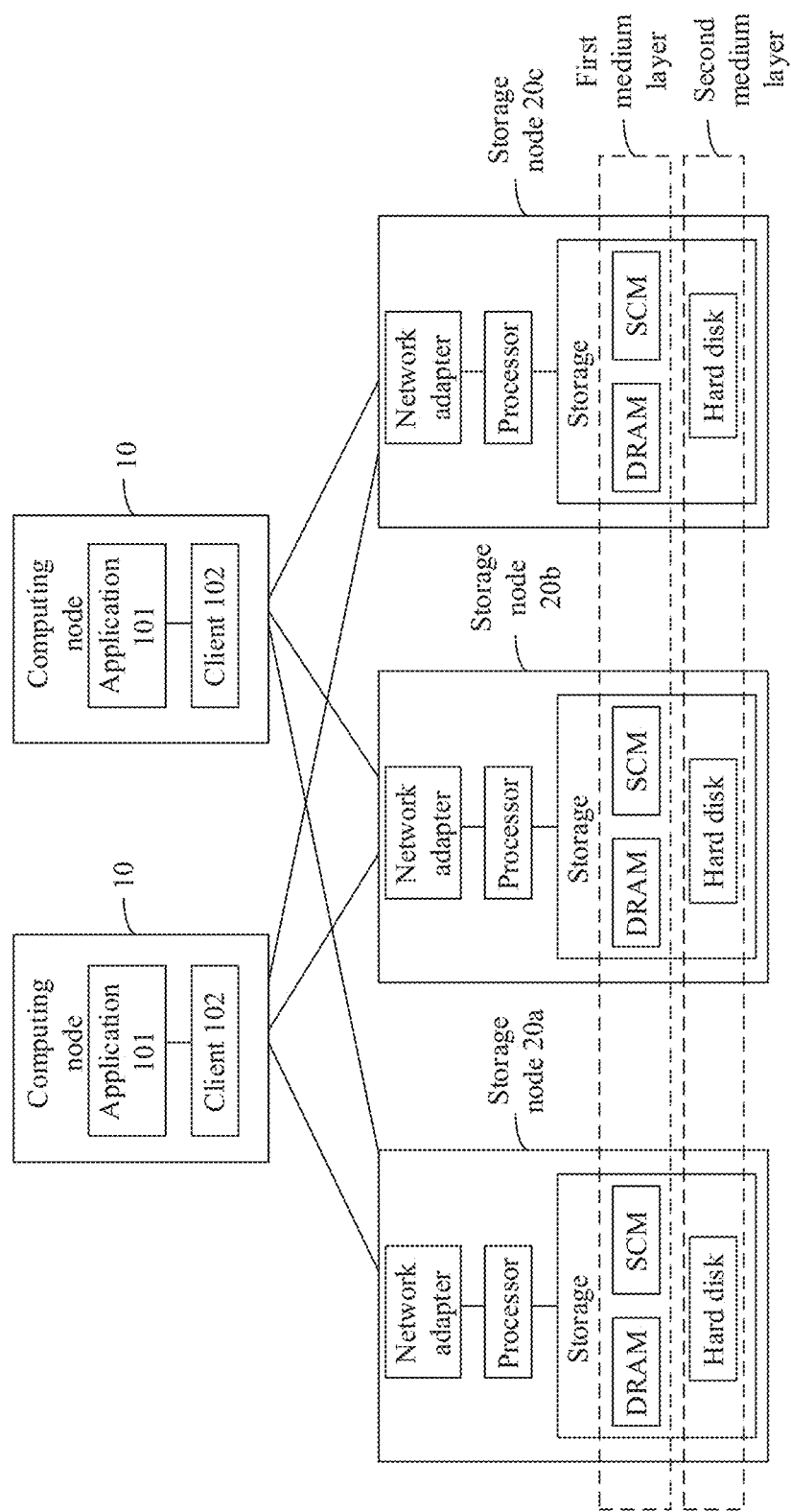
FIG. 1 is a diagram of an architecture of a storage system according to an embodiment of this application.

FIG. 1 is a schematic diagram of a structure of a storage system according to an embodiment of this application. As shown in FIG. 1, the storage system includes a computing node cluster and a storage node cluster. The computing node cluster includes one or more computing nodes 10 (two computing nodes 10 are shown in FIG. 1, but the computing node cluster is not limited to the two computing nodes 10). The computing node 10 is a computing device on a user side, such as a server or a desktop computer. At a hardware level, a central processing unit and a memory (not shown in FIG. 1) are disposed in the computing node 10. At a software level, an application (application) program 101 (application for short) and a client program 102 (client for short) are running on the computing node 10. The application 101 is a general term of various applications presented to a user. The client 102 is configured to receive a data access request triggered by the application 101, interact with a storage node 20, and send the data access request to the storage node 20. The client 102 is further configured to receive data from the storage node, and forward the data to the application 101. It should be understood that, when the client 102 is a software program, a function of the client 102 is implemented by running a program in the memory by the central processing unit included in the computing node 10. Alternatively, the client 102 may be implemented by a hardware component located inside the computing node 10. Any client 102 in the computing node cluster can access any storage node 20 in the storage node cluster.

The storage node cluster includes one or more storage nodes 20 (three storage nodes 20 are shown in FIG. 1, but the storage node cluster is not limited to the three storage nodes 20), and the storage nodes 20 may be interconnected. The storage node is, for example, a server, a desktop computer, or a controller or a disk enclosure of a storage array. Functionally, the storage node 20 is mainly configured to perform data computing, processing, or the like.

At a hardware level, as shown in FIG. 1, the storage node 20 includes at least a storage, a network adapter, and one or more central processing units.

The central processing unit (central processing unit, CPU) is configured to process data from the outside of the storage node 20 or data generated inside the storage node 20.

Figure 2:
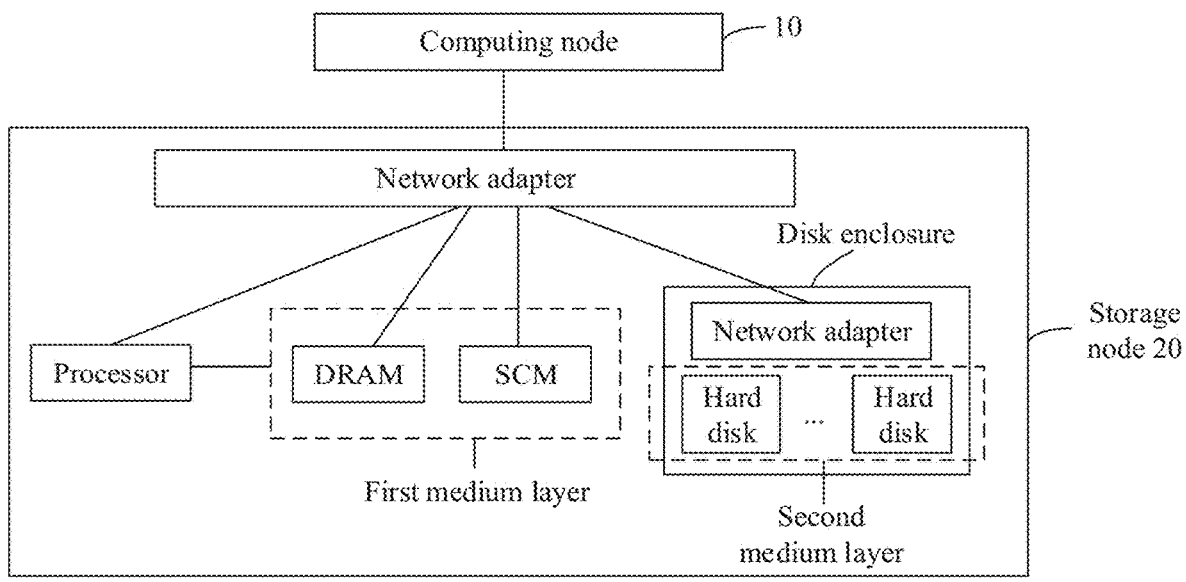
FIG. 2 is a diagram of an architecture of another storage system according to an embodiment of this application.

The storage is an apparatus configured to store data. In this embodiment of this application, the storage may be a memory, or may be a hard disk. The memory is an internal memory that directly exchanges data with the processor. The memory can read and write the data at a fast speed at any time, and serves as a temporary data memory of an operating system or another running program. The memory includes one or more types of storages. For example, the memory may be a random access memory, or may be a read-only memory (ROM). For example, the random access memory may be a dynamic random access memory (DRAM), or may be a storage class memory (SCM). The DRAM is a semiconductor memory, and is a volatile memory (volatile memory) device like most random access memories (RAMs). The SCM is a composite storage technology that combines characteristics of both a conventional storage apparatus and a memory. The SCM can provide a higher read/write speed than the hard disk, but is slower than the DRAM in operation speed and is cheaper than the DRAM in costs. It should be noted that the processor can directly access the memory. For example, as shown in FIG. 2, the processor can directly access the DRAM and the SCM.

However, the DRAM and the SCM are merely example descriptions in this embodiment. In some possible cases, the memory may include only one of the DRAM and the SCM. Alternatively, the memory may include another random access memory, for example, a static random access memory (SRAM). For example, the read only memory may be a programmable read only memory (PROM), an erasable programmable read only memory (EPROM), or the like. In addition, the memory may alternatively be a dual in-line memory module or a dual in-line memory module (DIMM), namely, a module composed of the dynamic random access memory (DRAM). In subsequent embodiments, an example in which the memory includes one type of storage is used for description, but this does not constitute a limitation on a quantity of storage types included in the memory.

The hard disk provides a lower data read/write speed than the memory, and is usually configured to persistently store data. For example, one or more hard disks are disposed inside a storage node 20a; or a disk enclosure is mounted outside the storage node 20 (as shown in FIG. 2), and a plurality of hard disks are disposed in the disk enclosure. Regardless of a deployment manner, these hard disks can be considered as hard disks included in the storage node 20. The hard disk herein may be a physical hard disk, or may be a logic domain or a fault domain that includes a plurality of physical hard disks. This is not limited in this embodiment of this application. In addition, the physical hard disk may be a solid state disk, a mechanical hard disk, or another type of hard disk.

It should be noted that the storage included in the memory and the hard disk are two completely different storage media, and are completely different in performance. The memory provides a higher data read speed and a smaller latency than the hard disk, in other words, performance of the memory is higher than performance of the hard disk. On this basis, in this embodiment of this application, as shown in FIG. 1 and FIG. 2, memories in the storage nodes 20 are referred to as a first medium layer, and hard disks in the storage nodes 20 are referred to as a second medium layer. Performance of the first medium layer is higher than performance of the second medium layer. Certainly, alternatively, memories in the storage nodes 20 may be referred to as a second medium layer, and hard disks in the storage nodes 20 may be referred to as a first medium layer. In this case, performance of the first medium layer is lower than performance of the second medium layer. Optionally, when the memory includes a plurality of storage media with different performance, each type of storage medium in the memory may be used as a medium layer. For example, in FIG. 1 and FIG. 2, in the storage nodes, DRAMs form a medium layer, SCMs form a medium layer, and hard disks form a medium layer. Optionally, in some possible cases, the first medium layer may be a solid state disk (solid state disk, SSD), and the second medium layer may be a hard disk drive (hard disk drive, HDD). Subsequent embodiments provide descriptions by using an example in which a memory includes one type of storage medium, and in storage nodes, storage media of this type in memories are used as a first medium layer and hard disks are used as a second medium layer.

The network adapter is configured to communicate with another storage node, or is configured to communicate with a disk enclosure coupled to the storage node. In addition, the network adapter can directly access the memory of the storage node. As shown in FIG. 2, the network adapter can directly access the DRAM and the SCM.

In another embodiment of the present invention, a storage system does not include a computing node. In another embodiment of the present invention, a computing node and a storage node in a storage system may be in a same node. A specific form of the storage system is not limited in the present invention. In addition, in this embodiment of the present invention, functions of the one or more CPUs in the storage node may be implemented by using a field programmable gate array (FPGA), an application-specific integrated circuit (ASIC), or the like, or a combination of a plurality of the foregoing devices. In this embodiment of the present invention, the foregoing various implementations are collectively referred to as being implemented by one or more processors.

Figure 3:
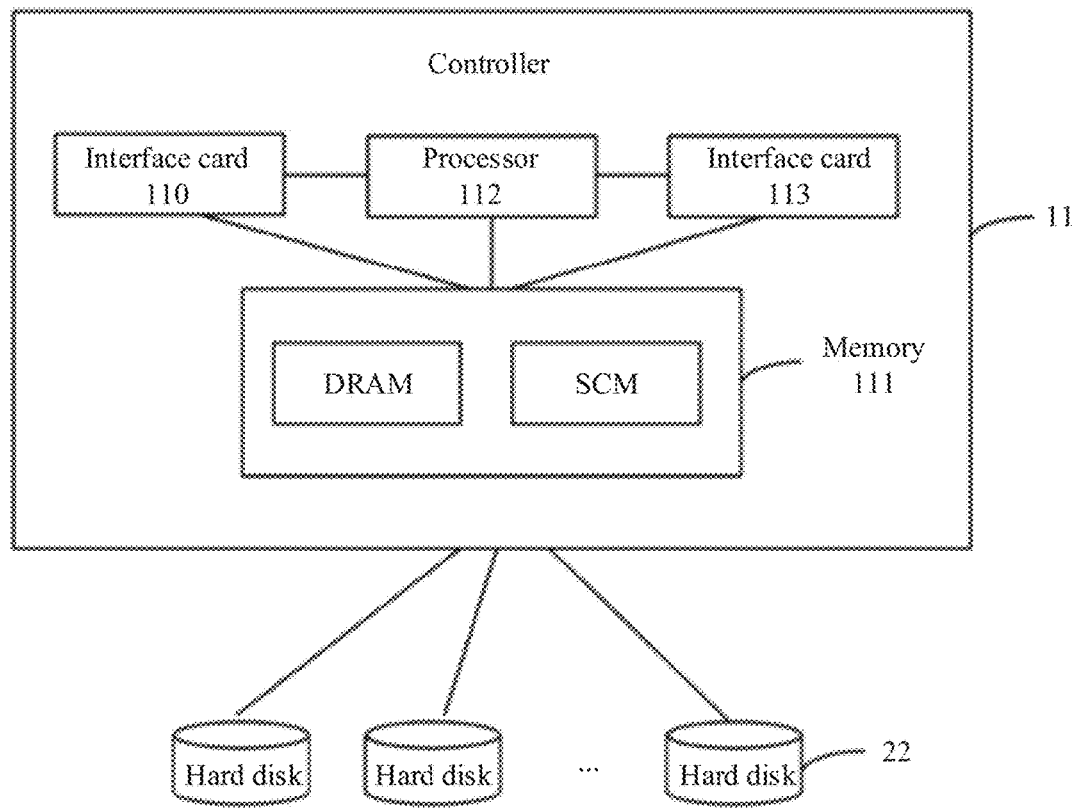
FIG. 3 is a system diagram of an architecture of a storage device according to an embodiment of this application.

FIG. 3 is a schematic diagram of a structure of another storage system according to an embodiment of this application. The storage system shown in FIG. 3 is a storage array. The storage array includes at least one controller (a controller 11 shown in FIG. 3) and a plurality of hard disks 22. The controller 11 is connected to a host (which is not shown in the figure) through a storage area network (SAN). The controller 11 may be a computing device, for example, a server and a desktop computer. An operating system and an application are installed on the controller 11. The controller 11 may receive an input/output (I/O) request from the host. The controller 11 may further store data (if exists) carried in the I/O request, and write the data into the hard disk 22. The hard disk 22 is a mechanical hard disk or a solid state disk. The solid state disk is a storage that uses a flash memory chip as a medium, and is also referred to as a solid state drive (SSD).

FIG. 3 is merely an example for description. In actual application, the storage array may include two or more controllers. A physical structure and a function of each controller are similar to those of the controller 11. In addition, a connection manner between the controllers and a connection manner between any controller and the hard disk 22 are not limited in this embodiment, provided that intercommunication can be performed between the controllers and between each controller and the hard disk 22. In addition, in this embodiment, the hard disk may be a physical hard disk, or may be a logic domain or a fault domain that includes a plurality of physical hard disks. This is not limited in this embodiment of this application.

As shown in FIG. 3, the controller 11 includes an interface card 110, one or more processors 112, and an interface card 113.

The interface card 110 is configured to communicate with the host, and the controller 11 may receive an operation instruction of the host by using the interface card 110. The processor 112 may be a central processing unit (CPU). In this embodiment of this application, the processor 112 may be configured to receive an I/O request from the host and process the I/O request. The I/O request may be a data write request or a data read request. The processor 112 may further send data in the data write request to the hard disk 22. The interface card 113 is configured to communicate with the hard disk 22. The controller 11 sends a write data request (including data, a logical address of the data, and a virtual address of the data) to the hard disk 22 for storage by using the interface card 113. In this embodiment of the present invention, the processor 112 may be alternatively implemented by using a field programmable gate array (FPGA), an application-specific integrated circuit (ASIC), or the like, or a combination of a plurality of the foregoing devices. In this embodiment of the present invention, the foregoing various implementations are collectively referred to as being implemented by one or more processors.

Optionally, the controller 11 further includes a memory 111. The memory 111 is configured to temporarily store data received from the host or data read from the hard disk 22. When receiving a plurality of write data requests sent by the host, the controller 11 may temporarily store, in the memory 111, data in the plurality of write data requests. When a capacity of the memory 111 reaches a specific threshold, data, a virtual address of the data, and a logical address allocated to the data that are stored in the memory 111 are sent to the hard disk 22. The hard disk 22 stores the received data. The memory 111 includes a volatile memory, a flash memory chip, or a combination thereof. The volatile memory is, for example, a random-access memory (RAM). The flash memory chip is, for example, various machine-readable media that can store program code, such as a floppy disk, a hard disk, or a compact disc. The memory 111 has a power failure protection function. The power failure protection function means that the data stored in the memory 111 is not lost when the system is powered off and then powered on again.

It should be noted that the memory 111 included in the controller 11 and the hard disk 22 are two completely different storage media. The memory provides a higher data read speed and a smaller latency than the hard disk, in other words, performance of the memory is higher than performance of the hard disk. In this embodiment of this application, the memory 111 with higher performance is referred to as a first medium layer, and the plurality of hard disks 22 with lower performance than the memory are referred to as a second medium layer, in other words, performance of the first medium layer is higher than performance of the second medium layer. Alternatively, the memory 111 with higher performance is referred to as a second medium layer, and the plurality of hard disks 22 with lower performance than the memory are referred to as a first medium layer. In this case, performance of the first medium layer is lower than performance of the second medium layer.

Erasure code is a data redundancy technology, and erasure code achieves higher disk utilization than a multi-copy policy. For example, Reed-Solomon code is common erasure code. An erasure code technology is mainly encoding original data by using an erasure code algorithm, to obtain redundancy, and storing the data and the redundancy together, to achieve fault tolerance. A basic idea of the technology is performing a specific calculation on n original data elements (hereinafter also referred to as "data units") to obtain m redundant elements (hereinafter also referred to as "check units"), where disk utilization is n/(n+m). When any m elements (including an original data element and a redundant element) in the n+m elements are faulty, the n original data elements can be recovered by using a corresponding reconstruction algorithm. A process of generating a check unit is referred to as encoding, and a process of recovering a lost data element is referred to as decoding. An erasure code ratio in this application is a ratio of a quantity n of data elements to a quantity m of redundant elements. The n data elements and the m redundant elements based on the erasure code technology belong to one stripe. The data element is also referred to as a data unit, and the redundant element is also referred to as a check unit. The following describes a stripe management method provided in the embodiments of this application.

Figure 4:
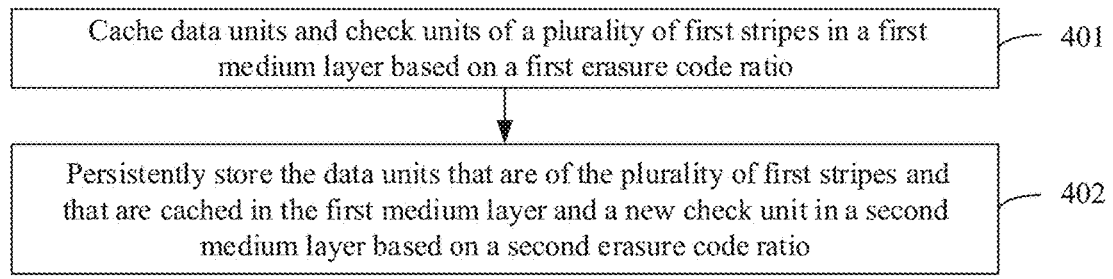
FIG. 4 is a flowchart of a stripe management method according to an embodiment of this application.

FIG. 4 is a flowchart of a stripe management method according to an embodiment of this application. The method may be applied to the storage system shown in FIG. 1 or FIG. 2, or may be applied to the storage system shown in FIG. 3. Refer to FIG. 4. The method includes the following steps.

Step 401: Cache data units and check units of a plurality of first stripes in a first medium layer based on a first erasure code ratio.

It can be learned from the foregoing descriptions in FIG. 1 to FIG. 3 that, a storage system includes a plurality of types of different storage media. This embodiment of this application explains the stripe management method by using an example in which a storage system includes two types of different storage media, and performance of the first medium layer is higher than performance of a second medium layer. For example, the first medium layer is a DRAM, and the second medium layer is a hard disk. Data is stored in the first medium layer based on the first erasure code ratio. That is, a stripe that complies with the first erasure code ratio is cached in the DRAM, that is, data units and a check unit in the stripe are all cached in the DRAM. That performance of the first medium layer is higher than performance of a second medium layer means that the first medium layer provides a higher read/write speed and a smaller latency than the second medium layer.

In this embodiment of this application, for the first medium layer and the second medium layer, the first erasure code ratio corresponding to the first medium layer and a second erasure code ratio corresponding to the second medium layer may be respectively obtained, and then data units and a check unit in the first stripe may be cached in the first medium layer based on the first erasure code ratio. That is, received data is divided into the data units based on the first erasure code ratio, and the corresponding check unit is obtained based on an erasure code algorithm, to obtain the first stripe that complies with the first erasure code ratio. In this embodiment of the present invention, when data units and a check unit in a stripe are cached in a DRAM, the stripe is a stripe that is not persistently stored in the storage system. When data units and a check unit in a stripe are stored in a non-volatile storage medium of the storage system, the stripe is a stripe that is persistently stored in the storage system. Further, in this embodiment of the present invention, when the first medium layer includes an SCM, and data units and a check unit in a stripe are stored in the SCM of the first medium layer, the stripe is still referred to as a stripe that is not persistently stored in the storage system, in other words, the stripe is cached in the SCM. In another implementation, when the first medium layer includes no SCM, the second medium layer includes an SCM, and data units and a check unit in a stripe are stored in the SCM of the second medium layer, the stripe is still referred to as a stripe that is persistently stored in the storage system.

If the stripe management method is applied to the storage system shown in FIG. 1 or FIG. 2, a management node in the storage system may obtain the first erasure code ratio and the second erasure code ratio. The management node is any one of the plurality of storage nodes in the storage system, or the management node is a node that is independent of the storage nodes and that is configured to manage the storage nodes in the storage system. In addition, the management node may obtain the first erasure code ratio and the second erasure code ratio during initialization, or may obtain the first erasure code ratio and the second erasure code ratio in a running process of the storage system. This is not limited in this embodiment of this application. If the stripe management method is applied to the storage system shown in FIG. 3, the controller in the storage system may obtain the first erasure code ratio and the second erasure code ratio. The following provides descriptions by using an example in which the management node obtains the first erasure code ratio and the second erasure code ratio.

In a possible implementation, the management node determines the first erasure code ratio or the second erasure code ratio based on a topology structure and a fault tolerance capability of the storage system. Both the first erasure code ratio and the second erasure code ratio may be determined based on the topology structure and the fault tolerance capability of the storage system; the first erasure code ratio is determined based on the topology structure and the fault tolerance capability of the storage system, and the second erasure code ratio is obtained based on the first erasure code ratio; or the second erasure code ratio is determined based on the topology structure and the fault tolerance capability of the storage system, and the first erasure code ratio is obtained based on the second erasure code ratio. This is not limited in this embodiment of this application. In addition, the topology structure is used to indicate a quantity of storage nodes included in the storage system, and the fault tolerance capability is used to indicate a quantity of faulty storage nodes that can be tolerated by the storage system. The quantity of faulty storage nodes that can be tolerated by the storage system is equal to a quantity of check units corresponding to the first erasure code ratio, or a quantity of check units corresponding to the second erasure code ratio.

The management node first obtains the topology structure of the storage system.

For example, the management node may store the topology structure of the storage system, receive the topology structure of the storage system that is sent by another device, or receive the topology structure of the storage system that is input by a user. The topology structure can indicate composition of the storage system, for example, the quantity of storage nodes included in the storage system and a quantity of subnodes included in each storage node. When the storage node is a server, a quantity of subnodes of the storage node is a quantity of physical hard disks included in the server or a quantity of hard disk logic domains obtained by dividing physical hard disks included in the corresponding storage node. When the storage node is a rack, a quantity of subnodes of the storage node is a quantity of servers included in the rack. Usually, one rack includes a plurality of servers.

For example, assuming that the storage system includes four servers, each server includes 60 physical hard disks, and every 15 physical hard disks are divided into one hard disk logic domain, it can be learned from the topology structure that the storage system includes four storage nodes, and each server is one storage node. Each storage node includes four hard disk logic domains, in other words, a quantity of subnodes included in each storage node is 4.

In addition to obtaining the topology structure of the storage system, the management node further obtains a security level and a fault tolerance capability of the storage system. In a possible implementation, a configuration interface is displayed on the management node, and the configuration interface includes a security level configuration item and a fault tolerance capability configuration item. The user inputs a required security level to the security level configuration item, and inputs, to the fault tolerance capability configuration item, a quantity t of nodes allowed to be faulty, where t is an integer greater than or equal to 1. The management node obtains the security level and the quantity t of nodes allowed to be faulty that are input by the user. The security level includes server-level security, rack-level security, and the like. The server-level security is used to indicate that the storage system can tolerate a maximum of t faulty servers. The rack-level security is used to indicate that the storage system can tolerate a maximum of t faulty racks. Optionally, the management node may determine the security level of the storage system based on the topology structure of the storage system according to a preset principle. The preset principle is a computing principle that can ensure reliability of the storage system. This is not limited in this embodiment of this application. In addition, the fault tolerance capability of the storage system may be alternatively a system default value. This is not limited in this embodiment of this application.

After obtaining the topology structure, the fault tolerance capability, and the security level of the storage system, the management node determines a value range of a quantity of data units in the first erasure code ratio by using the following formula (1):

$$N \leq (k*M) - M \quad (1)$$

N is the quantity of data units corresponding to the first erasure code ratio. k is a quantity of nodes included in the storage system. When the security level is server-level security, the node is a server; or when the security level is rack-level security, the node is a rack. M is a quantity that is of faulty nodes that can be tolerated by the storage system and that is indicated by the fault tolerance capability, namely, a quantity of check units in the first erasure code ratio. It should be noted that M may be a default value, or may be a value customized by the user; and M is an integer greater than or equal to 1, for example, M=2.

After determining the value range of the quantity of data units in the first erasure code ratio, the management node determines a plurality of first candidate erasure code ratios based on the value range and M. Each candidate erasure code ratio corresponds to one value of the value range. Then, an erasure code ratio corresponding to a smallest write amplification value is selected from the plurality of first candidate erasure code ratios as the first erasure code ratio.

Write amplification means that an amount of data actually written in a storage node is greater than an amount of data received from a computing node. In this embodiment of this application, the write amplification is represented by using a write amplification value. For any first candidate erasure code ratio, a write amplification value corresponding to the first candidate erasure code ratio is equal to a ratio of a total quantity of data units and check units in the first candidate erasure code ratio to a quantity of data units. For example, an erasure code ratio 6:2 is used to indicate that every six data units correspond to two check units. In this case, a write amplification value corresponding to the erasure code ratio is (6+2)/6.

For example, assuming that the topology structure of the storage system indicates that the storage system includes four servers, and the security level input by the user is server-level security, k=4. It is assumed that the quantity of faulty storage nodes that can be tolerated by the storage system is 2, in other words, M=2. It can be learned from the foregoing formula (1) that the value range of the quantity of data units in the first erasure code ratio is N≤4*2-2, in other words, N≤6. After determining the value range of the quantity of data units in the first erasure code ratio, the following plurality of common first candidate erasure code ratios may be obtained based on the value range and the quantity of check units: 6:2, 4:2, and 2:2. Because the ratio 6:2 has a smallest write amplification value in the three ratios, the ratio 6:2 is used as the first erasure code ratio.

In addition to the first erasure code ratio, the management node is further configured to obtain the second erasure code ratio based on the topology structure and the fault tolerance capability of the storage system. Specifically, the management node determines a value range of a quantity of data units in the second erasure code ratio by using the following formula (2):

$$X \leq (i*Y) - Y \quad (2)$$

X is the quantity of data units corresponding to the second erasure code ratio, and X is greater than N. i is a quantity of subnodes of the node included in the storage system. When the security level is server-level security, i is a quantity of subnodes of a server included in the storage system. The subnode of the server may be a physical hard disk or a hard disk logic domain connected to the server. When the security level is rack-level security, i is a quantity of subnodes of a rack included in the storage system. The subnode of the rack is a server included in the rack. Y is a quantity that is of faulty nodes that can be tolerated by the storage system and that is indicated by the fault tolerance capability, in other words, Y is a quantity of check units corresponding to the second erasure code ratio. It should be noted that Y may be a default value, or may be a value customized by the user; and Y is greater than or equal to 1, for example, Y=2. In addition, Y may be or may not be equal to M. This is not limited in this embodiment of this application. It should be further noted that the security level may be configured by the user in the foregoing described configuration manner. In this case, the management node directly obtains the security level configured by the user. Alternatively, the security level may be determined by the management node based on the topology structure of the storage system according to a preset principle. The preset principle is a computing principle that can ensure reliability of the storage system. This is not limited in this embodiment of this application.

After determining the value range of the quantity of data units in the second erasure code ratio, the management node determines the second erasure code ratio based on the value range and Y.

The foregoing storage system including the four servers is still used as an example. Assuming that each server includes four hard disk logic domains, when the security level is server-level security, there are four subnodes in each server included in the storage system. In this case, a total quantity of subnodes of the four servers is 16. Assuming that the quantity that is of faulty nodes that can be tolerated by the storage system and that is indicated by the fault tolerance capability is 2, in other words, Y=2, it can be learned, according to the foregoing formula (2), that X≤(16*2)−2, in other words, X≤30. Considering a system reliability constraint mechanism, the management node may select 24 as the quantity of data units based on the value range. In this case, the second erasure code ratio is 24:2.

It can be learned from the foregoing that N in the first erasure code ratio is not equal to X in the second erasure code ratio, and N is less than X. In addition, M in the first erasure code ratio may be or may not be equal to Y in the second erasure code ratio. In addition, a ratio of N to M is not equal to a ratio of X to Y.

The foregoing describes an implementation process of separately determining the first erasure code ratio and the second erasure code ratio based on the topology structure and the fault tolerance capability of the storage system. In some possible implementations, after determining the first erasure code ratio with reference to the foregoing manner, the management node determines the second erasure code ratio X:Y based on the first erasure code ratio N:M and preset w. X is equal to w*N, and Y is equal to M or greater than M. Alternatively, after determining the second erasure code ratio with reference to the foregoing manner, the management node determines the first erasure code ratio N:M based on the second erasure code ratio X:Y and preset w. N is equal to X/w, and M is equal to Y or less than Y.

After obtaining the first erasure code ratio and the second erasure code ratio, the management node calculates a ratio of the quantity X of data units in the second erasure code ratio to the quantity N of data units in the first erasure code ratio. The ratio is equal to a quantity w of first check matrices included in data stored in the first medium layer based on the first erasure code ratio. For example, when the quantity of data units in the second erasure code ratio is X=24, and the quantity of data units in the first erasure code ratio is N=6, it may be determined that the quantity of first check matrices included in the data stored in the first medium layer based on the first erasure code ratio is w=4. Therefore, it can be learned that, in the foregoing implementation in which the second erasure code ratio is obtained based on the first erasure code ratio or the first erasure code ratio is obtained based on the second erasure code ratio, preset w is actually the quantity of first check matrices included in the data stored in the first medium layer based on the first erasure code ratio. One first check matrix is one stripe that complies with the first erasure code ratio.

In this embodiment of the present invention, in another implementation, a manager may configure the first erasure code ratio and the second erasure code ratio by using the management node.

After the first erasure code ratio, the second erasure code ratio, and w are obtained, and then, when the storage node receives a write data request sent by a computing node, the storage node writes data in the first medium layer based on the first erasure code ratio and w. The write data request includes to-be-written data. The following describes the process by using an example in which a target storage node in the storage system receives a write data request sent by a computing node.

For example, the target storage node receives the write data request sent by the computing node, and when an amount of received to-be-written data reaches a size of N data units, the target storage node divides the to-be-written data into N data units, and generates M check units based on the N data units. The N data units and the M check units belong to one piece of subdata. The subdata corresponds to one first check matrix. The first check matrix includes the N data units and the M check units. Then, the target storage node stores, in the first medium layer of the storage system, the N data units and the M check units that are included in the first check matrix. Simultaneously, the target storage node continues to receive a write data request sent by the computing node, obtain another first check matrix in the foregoing manner, and store the another first check matrix in the first medium layer. In this way, after writing, in the first medium layer in the foregoing manner, data units and check units that are included in w first check matrices, the target storage node can perform subsequent step 402.

For example, the first erasure code ratio is 6:2, that is, N=6, and M=2; and w=4. When an amount of to-be-written data that is sent by the computing node and that is received by the target storage node reaches a size of six data units, the target storage node divides the to-be-written data into six data units, and generates two check units based on the six data units; and then generates a first check matrix that includes the six data units and the two check units. The eight units included in the first check matrix are stored in memories of the storage nodes in the storage system.

Specifically, the target storage node may distribute check units included in each first check matrix in a same storage node, and may distribute, in the storage nodes based on an even distribution principle, data units included in each first check matrix.

Figure 5:
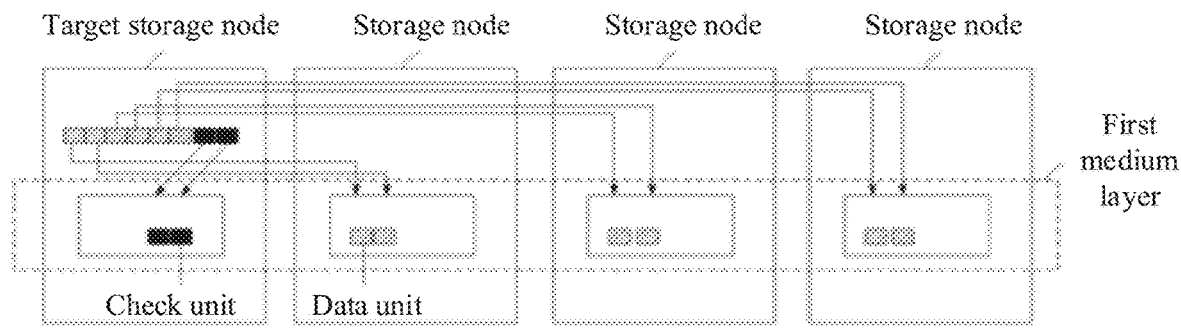
FIG. 5 is a schematic diagram of distribution of units of one first check matrix in a first medium layer according to an embodiment of this application.

Referring to FIG. 5, it is assumed that the storage nodes included in the storage system are four servers, and the memories included in the four servers are the first medium layer; the first erasure code ratio is 6:2, that is, N=6, M=2; and w=4. Because M=2, a memory of each server is allowed to store a maximum of two of eight units in a first check matrix. On this basis, after obtaining a first check matrix, the target storage node stores, in a memory of the target storage node, two check units included in the first check matrix, and forwards remaining six data units to other three servers for storage. For example, referring to FIG. 5, each of the other three servers stores two data units. In this way, after four first check matrices are stored in the first medium layer, distribution of 32 units included in the four check matrices in the storage nodes of the storage system is shown in FIG. 6.

Figure 6:
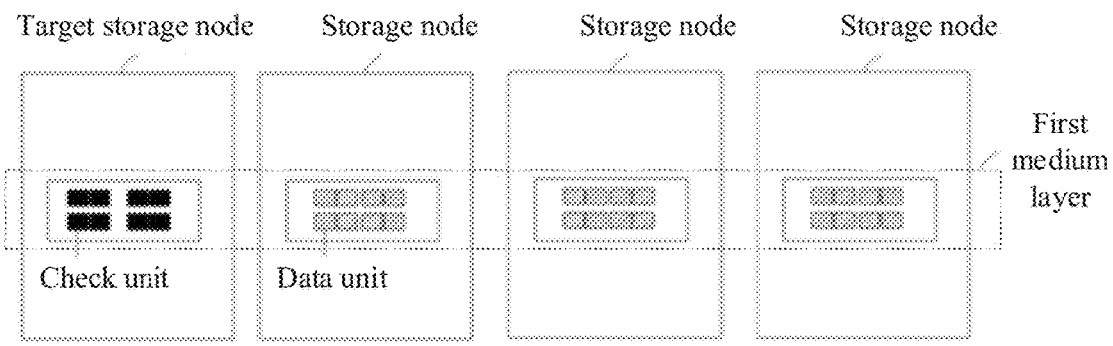
FIG. 6 is a schematic diagram of distribution of units of w first check matrices in a first medium layer according to an embodiment of this application.

FIG. 5 and FIG. 6 show only one example type of possible distribution of units in a first check matrix according to an embodiment of this application. Optionally, the target storage node may randomly evenly distribute a plurality of units in the storage nodes based on a maximum quantity of units allowed to be distributed in each storage node in the storage system and a quantity of units included in the first check matrix. In other words, check units are not limited to being in a same storage node. For example, in the foregoing example, one data unit and one check unit in one first check matrix may be stored in the target storage node, and the other check unit and one data unit may be stored in another storage node. In this way, there are still four remaining data units. The four data units are respectively stored in two remaining storage nodes. Further, when the two check units in the first check matrix are a check unit p and a check unit q, in the four first check matrices, four check units p are stored in one storage node, and four check units q are stored in one storage node; and the storage node in which the four check units p are located may be different from the storage node in which the four check units q are located.

The foregoing describes a process of caching data in the first medium layer based on the first erasure code ratio when the storage system is the storage system shown in FIG. 1 or FIG. 2. Optionally, when the storage system is the storage array shown in FIG. 3, the controller in the storage array may determine the first erasure code ratio, the second erasure code ratio, and the quantity w of first check matrices included in the data stored in the first medium layer. For a determining method, refer to the foregoing described method. Details are not described herein again in this embodiment of this application. After determining the first erasure code ratio, the second erasure code ratio, and w, the controller may cache data in the first medium layer based on the first erasure code ratio and w. The first medium layer is the memory of the controller included in the storage system. It should be noted that the controller generates w first check matrices with reference to the foregoing method. Based on a quantity of controllers included in the storage system and/or a quantity of memories included in each controller, with reference to the foregoing method, data units and a check unit included in each first check matrix are stored in memories of controllers in a distributed manner.

Step 402: Persistently store the data units that are of the plurality of first stripes and that are cached in the first medium layer and a new check unit in the second medium layer based on the second erasure code ratio.

The new check unit is generated by using the check units of the plurality of first stripes, and the data units of the plurality of first stripes and the new check unit belong to a stripe (a second stripe) that complies with the second erasure code ratio.

When data cached in the first medium layer based on the first erasure code ratio meets a specified condition, the storage node or the controller stores, in the second medium layer based on the second erasure code ratio, the data that meets the specified condition. For example, the specified condition may be that a quantity of data units that are of the plurality of first stripes complying with the first erasure code ratio and that are cached in the first medium layer reaches a quantity of data units in the second stripe that complies with the second erasure code ratio. In other words, a complete second stripe is obtained in the first medium layer. The second erasure code ratio is X:Y, that is, data stored in the second medium layer includes X data units and Y check units.

The following still describes the step by using an example in which the stripe management method is applied to the storage system shown in FIG. 1 or FIG. 2. In the storage system, the second medium layer includes hard disks included in the storage nodes in the storage system.

For example, after the w complete first check matrices are obtained, that is, after the data units and the check units that are included in the w first check matrices are cached in the first medium layer, the X data units are obtained based on N data units included in each of the w first check matrices included in the data stored in the first medium layer, where X is an integer multiple of N; the Y check units are obtained through calculation, to generate a second check matrix, where the second check matrix includes the X data units and the Y check units;

and the second check matrix is written in the second medium layer. The process may be implemented in the following several different implementations. One second check matrix is one stripe that complies with the second erasure code ratio.

In a first implementation, after obtaining the w complete first check matrices by using the foregoing step 401, the target storage node obtains the Y check units in the second check matrix through calculation based on w×N data units included in the w first check matrices. Then, the target storage node stores, in the second medium layer, the Y check units obtained through calculation. For the other storage nodes, when the specified condition is met, each storage node stores, in the second medium layer, data units that belong to the w first check matrices and that are stored in the storage node. In this way, the w×N data units stored in the second medium layer are the X data units of the second check matrix, and the Y check units obtained by the target storage node through calculation are the Y check units included in the second check matrix.

When the target storage node stores, in the second medium layer, data units stored in the target storage node and the Y check units, if a quantity of hard disks included in the second medium layer is greater than a total quantity of units included in the second check matrix, the target storage node selects, based on the quantity Y of the check units obtained through calculation, Y hard disks from a plurality of hard disks included in the target storage node. Then, the target storage node writes the Y check units in the selected hard disks, where one unit is written in each hard disk. Optionally, if the target storage node further stores data units that belong to the w first check matrices, the target storage node selects one hard disk for each data unit from the hard disks included in the target storage node, and writes the data units in selected hard disks, where one unit is also written in each hard disk.

Optionally, if a quantity of hard disks included in the second medium layer is not greater than a total quantity of units included in the second check matrix, the storage node determines, based on the quantity of check units included in the second check matrix, a maximum quantity of units allowed to be distributed in each hard disk in the second medium layer. Then, if the target storage node further stores data units that belong to the w first check matrices, the target storage node selects, based on the maximum quantity of units, a quantity of data units that belong to the w first check matrices and that are stored in the target storage node, and Y, a plurality of hard disks from hard disks included in the target storage node, and then writes the stored data units and check units in the plurality of selected hard disks. Certainly, if the target storage node stores no data unit that belongs to the w first check matrices, the target storage node selects, based on the maximum quantity of units and Y, a plurality of hard disks from hard disks included in the target storage node, and then writes the Y check units in the selected hard disks. In this case, one hard disk may store a plurality of units in the second check matrix, but a quantity of stored units does not exceed the maximum quantity of units allowed to be distributed in the hard disk. Any storage node other than the target storage node can write, in the second medium layer with reference to the foregoing method, data units that belong to the w first check matrices and that are stored in the storage node.

Figure 7:
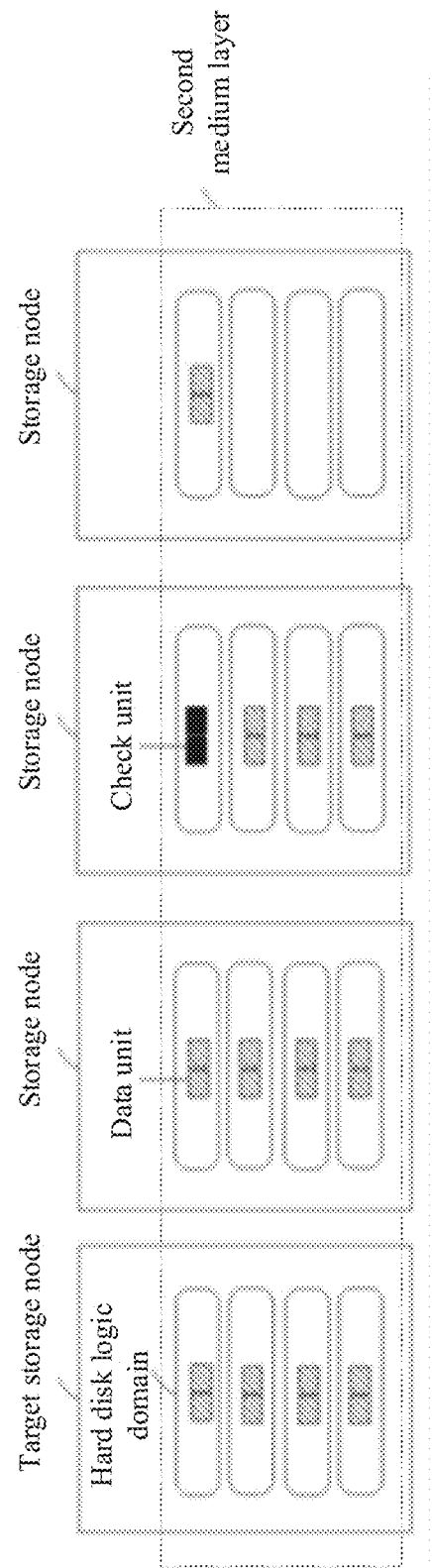
FIG. 7 is a schematic diagram of distribution of units of a second check matrix in a second medium layer according to an embodiment of this application.

For example, referring to FIG. 7, it is assumed that the second medium layer includes 16 hard disk logic domains, and the 16 hard disk logic domains respectively belong to four storage nodes; the w first check matrices include 24 data units in total, that is, a quantity of data units included in the second check matrix is 24; and a quantity of check units obtained by the target storage node through calculation is 2. Because the quantity of check units included in the second check matrix is 2, it can be learned that a maximum quantity of units allowed to be distributed in each hard disk logic domain is 2. In this case, when the storage nodes store the 24 data units and two check units in the second medium layer in the foregoing described manner, for three of the four storage nodes, two units are stored in each hard disk logic domain of each of the three storage nodes, in other words, each storage node stores eight units in total. The other storage node may store two units in one hard disk logic domain of the storage node, or may store one unit in each of two hard disk logic domains of the storage node.

In a second implementation, after obtaining the w complete first check matrices, the target storage node obtains the Y check units in the second check matrix based on w×M check units included in the w first check matrices. Then, the target storage node stores, in the second medium layer, the Y check units obtained through calculation. For the other storage nodes, when an amount of data in a cache of each storage node reaches a specific threshold, the storage node stores, in the second medium layer, data units that belong to the w first check matrices and that are stored in the storage node.

The second implementation is separately described for the following several different cases.

(1) When all check units included in the w first check matrices are stored in the target storage node, the target storage node obtains the w×M check units stored in the target storage node, and then obtains the Y check units based on the w×M check units.

For example, when M check units included in each first check matrix are respectively a check unit p and a check unit q, the target storage node performs an exclusive OR operation or another calculation on w stored check units p to obtain a check unit p' in the second check matrix, and performs an exclusive OR operation or another calculation on w stored check units q to obtain a check unit q' in the second check matrix. Therefore, it can be learned that, in this embodiment of this application, the check units of the second check matrix can be obtained by directly performing a calculation on the w×M check units included in the first check matrices. Compared with recalculating the check units based on all the data units in the w first check matrices, a computing amount is reduced. In addition, because all the check units in the first check matrices are stored in the same storage node, the storage node can directly obtain the stored check units to obtain the check units in the second check matrix. Compared with a case in which the check units are stored in the storage nodes in a distributed manner, the check units do not need to be obtained across the storage nodes, so that a network forwarding amount is reduced.

After obtaining the Y check units through calculation, with reference to the method described in the foregoing first embodiment, the target storage node stores the Y check units in the second medium layer, or stores data units that belong to the w check matrices and that are stored in the target storage node and the Y check units in the second medium layer. After the specified condition is met, each of the other storage nodes stores, in the second medium layer, data units that are stored in the storage node. In this way, the w first check matrices stored in the storage nodes are combined into the second check matrix, to be stored in the second medium layer.

Figure 8:
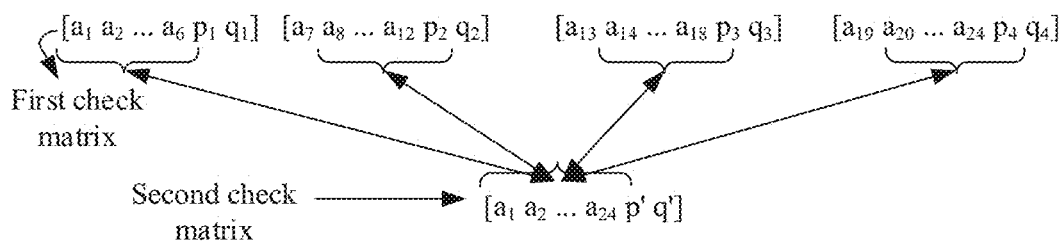
FIG. 8 is a schematic diagram of a principle of combining w first check matrices to obtain a second check matrix according to an embodiment of this application.

FIG. 8 is a schematic diagram of a principle of combining w first check matrices to obtain a second check matrix according to an embodiment of this application. As shown in FIG. 8, w=4, the first six columns of elements a1 to a6 in the $1^{st}$ first check matrix are six data units, and two remaining columns of elements p1 and q1 are two check units. p1 is a check unit p, and q1 is a check unit q. Likewise, a7 to a12 in the $2^{nd}$ first check matrix are six data units, and two remaining columns of elements p2 and q2 are two check units. The following can be deduced from this. The first six columns of elements of each check matrix are taken out to form 24 data units of the second check matrix. Check units p (p1 to p4) in the first check matrices are taken out, and an exclusive OR operation or another calculation is performed on the check units to obtain a check unit p' in the second check matrix. Check units q (q1 to q4) in the first check matrices are taken out, and an exclusive OR operation or another calculation is performed on the check units to obtain a check unit q' in the second check matrix.

It should be noted that, FIG. 8 describes an example process of combining the w first check matrices into the second check matrix. In some possible application scenarios, for example, when performance of the first medium layer is lower than performance of the second medium layer, in a process of reading data from the first medium layer to the second medium layer, the second check matrix may be divided into the w first check matrices. In this case, the w first check matrices can be obtained only by reversely performing the foregoing process. This is not limited in this embodiment of this application.

Optionally, when M check units included in each first check matrix are a check unit r, the target storage node performs an exclusive OR operation on w stored check units r, to obtain a check unit r' in the second check matrix through incremental calculation. Then, the target storage node may obtain the data units that are in the first check matrices and that are stored in the target storage node and the other storage nodes, and may obtain a check unit p' and a check unit q' through calculation based on w×N obtained data units. The check unit r', check unit p', and check unit q' that are obtained through calculation are used as the Y check units in the second check matrix. Therefore, it can be learned that Y is not equal to M in this implementation. In addition, a process of calculating the check unit r' based on the data units is relatively complex. Therefore, in this embodiment of this application, the check unit r' in the second check matrix is obtained through incremental calculation based on the check units r in the first check matrices, so that computing overheads are reduced. In addition, the check unit p' and the check unit q' are obtained through calculation based on the w×N data units. Therefore, the second check matrix includes the three check units, so that redundancy of data stored in the second medium layer is improved, thereby improving a fault tolerance capability.

Figure 9:
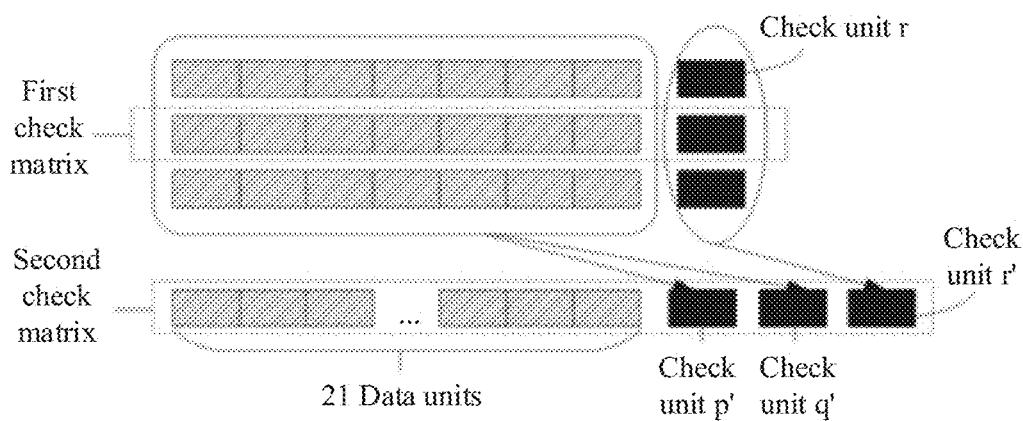
FIG. 9 is a schematic diagram of obtaining a check unit of a second check matrix according to an embodiment of this application.

For example, referring to FIG. 9, assuming that there are three first check matrices, and each first check matrix includes seven data units and one check unit r, the target storage node performs an exclusive OR operation on three stored check units r to obtain a check unit r' in the second check matrix. Then, the target storage node obtains 21 data units stored in the target storage node and the other storage nodes, and obtains a check unit p' and a check unit q' through calculation based on the 21 data units. In this way, the Y check units included in the second check matrix are the generated check unit p', check unit q', and check unit r'. Therefore, it can be learned that in this implementation, redundancy of data stored in the second medium layer can be improved, so that a fault tolerance capability can be improved, and some computing overheads can be further reduced.

After obtaining the Y check units through calculation, the target storage node also stores stored data units and the Y check units in the second medium layer with reference to the foregoing method described in the first implementation. After an amount of data in a cache of each of the other storage nodes reaches a specific threshold, the storage node stores, in the second medium layer, data units stored in the storage node. Details are not described herein again in this embodiment of this application.

(2) When the w×M check units included in the first check matrices are stored in different storage nodes in a distributed manner, the target storage node obtains the stored check units from the storage nodes, and then obtains the Y check units based on w×M obtained check units. For an implementation in which the target storage node obtains the Y check units based on the w×M obtained check units, refer to the foregoing implementation (1). Details are not described again in this embodiment of this application. After obtaining the Y check units, the target storage node stores stored data units and the Y check units in the second medium layer with reference to the foregoing method described in the first implementation. After an amount of data in a cache of each of the other storage nodes reaches a specific threshold, the storage node stores, in the second medium layer, data units stored in the storage node. Details are not described herein again in this embodiment of this application.

In a third implementation, after obtaining the w complete first check matrices, the target storage node writes, in the second medium layer, units that belong to the w first check matrices and that are stored in the target storage node. After an amount of data stored in a cache of each of the other storage nodes reaches a specific threshold, the storage node also writes, in the second medium layer, units that belong to the w first check matrices and that are stored in the storage node. Then, the target storage node obtains w×M check units written in the second medium layer; and then obtains Y check units through calculation based on the w×M check units, and writes, in the second medium layer as the Y check units of the second check matrix, the Y check units obtained through calculation.

If a quantity of hard disks included in the second medium layer is greater than a total quantity of units included in the second check matrix, when the storage nodes write, in the second medium layer, the data units and the check units that belong to the w first check matrices and that are stored in the storage nodes, for the data units, the storage nodes may select one hard disk for each data unit, and write each data unit in the hard disk selected for the corresponding data unit. Hard disks selected for different data units are also different. In this way, the X data units included in the second check matrix are written in X hard disks. For the check units in the w first check matrices, the storage nodes may store, in remaining hard disks other than the X hard disks, the check units stored in the storage nodes.

It should be noted that, when the check units are written, one check unit may be written in each hard disk. In this way, the w×M check units are written in w×M hard disks. Alternatively, all the check units may be written in one hard disk. Alternatively, the w×M check units may be written in M hard disks. Check units written in each of the M hard disks are check units located in a same column in the first check matrices. For example, when M=2, one of two check units is a check unit p, and the other check unit is a check unit q, in the first check matrices, check units p are written in one hard disk, and check units q are written in another hard disk.

After the storage nodes write, in the second medium layer, the data units and the check units that belong to the w first check matrices and that are stored in the storage nodes, the target storage node obtains the w×M check units from the second medium layer. If the w×M check units are written in w×M hard disks, the target storage node reads the w×M check units from the w×M hard disks. If all the check units are written in one hard disk, the target storage node obtains the w×M check units at one time from the hard disk, so that a quantity of network communication times can be reduced, thereby saving a bandwidth resource. If the w×M check units are written in M hard disks, and check units written in each of the M hard disks are check units located in a same column in the first check matrices, the target storage node reads the check units located in the same column from each hard disk, to obtain the w×M check units. In this way, a quantity of network communication times can also be reduced to a specific extent, thereby saving a bandwidth resource.

After obtaining the w×M check units, the target storage node obtains the Y check units through calculation based on the w×M check units with reference to the foregoing method described in the first implementation, and then respectively writes the Y check units in Y hard disks. One check unit is written in each hard disk. In addition, the Y hard disks in which the Y check units are written are not hard disks in the X hard disks in which the data units are written.

Optionally, if a quantity of hard disks included in the second medium layer is not greater than a total quantity of units included in the second check matrix, the storage nodes may write two or more units in one hard disk with reference to the method described in the foregoing first implementation, provided that a maximum quantity of units allowed to be stored is not exceeded. Similarly, in this case, the w×M check units included in the first check matrices may be stored in a hard disk of a same storage node. Alternatively, check units located in a same column in the w×M check units included in the first check matrices may be stored in a hard disk of one storage node, for example, stored in a same hard disk logic domain of one storage node, or stored in one physical hard disk in one storage node, to reduce a quantity of network forwarding times required when the Y check units in the second check matrix are calculated.

Figure 10:
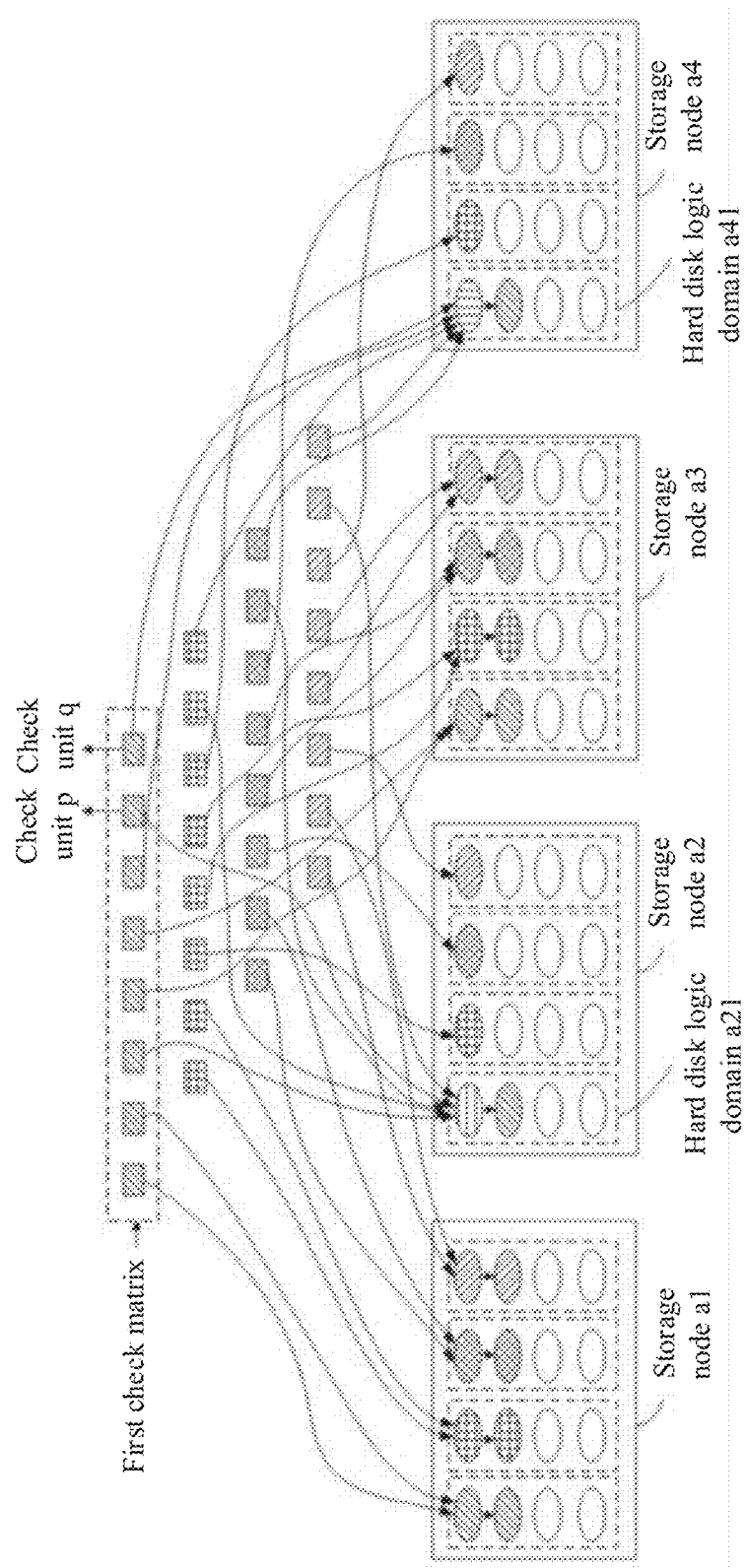
FIG. 10 is a schematic diagram of writing data in a second medium layer based on a second erasure code ratio according to an embodiment of this application.

For example, FIG. 10 is a schematic diagram of writing data in a second medium layer based on a second erasure code ratio according to an embodiment of this application. As shown in FIG. 10, a quantity of first check matrices is w=4, and each first check matrix includes six data units and two check units. The two check units are respectively a check unit p and a check unit q. The second medium layer includes 16 hard disk logic domains distributed in four storage nodes (a1 to a4), four hard disk logic domains are distributed in each storage node, and each hard disk logic domain includes 4 physical hard disks. Because a quantity of check units is 2, a maximum of two units in a second check matrix are allowed to be distributed in each hard disk logic domain. On this basis, two hard disk logic domains are first selected from the 16 hard disk logic domains. For example, the two selected hard disk logic domains are respectively a hard disk logic domain a21 in the storage node a2 and a hard disk logic domain a41 in the storage node a4. Then, storage nodes that store check units p of first check matrices write, in a physical hard disk of the hard disk logic domain a21, the check units p stored in the storage nodes. For example, the check units p in the first check matrices are written in the first physical hard disk of the hard disk logic domain a21. Likewise, storage nodes that store check units q of the first check matrices write, in the first physical hard disk of the hard disk logic domain a41, the check units q stored in the storage nodes. Then, for the hard disk logic domain a21, a target storage node or the storage node a2 performs an exclusive OR operation on the four check units p that are in the four first check matrices and that are written in the hard disk logic domain a21, to obtain a check unit p' in the second check matrix, and stores the check unit p' in the hard disk logic domain a21. Each hard disk logic domain is allowed to store a maximum of two units in the second check matrix. Therefore, after the check unit p' that is in the second check matrix and that is obtained through calculation is written in the hard disk logic domain a21, the hard disk logic domain a21 can further store a maximum of one data unit in the second check matrix. Likewise, for the hard disk logic domain a41, the target storage node or the storage node a4 may also perform an exclusive OR operation on the four check units q stored in the hard disk logic domain a41, to obtain a check unit q' in the second check matrix through incremental calculation, and store the check unit q' in the hard disk logic domain a41. In this way, the hard disk logic domain a41 can also further store a maximum of one data unit in the second check matrix. Then, for the six data units included in each first check matrix, the storage nodes distribute, according to a principle that a maximum of two units in the second check matrix are distributed in each hard disk logic domain, 24 data units in the 16 hard disk logic domains included in the four storage nodes.

The foregoing describes a process of caching data in the first medium layer based on the first erasure code ratio when the storage system is the storage system shown in FIG. 1 or FIG. 2. Optionally, when the storage system is the storage array shown in FIG. 3, the foregoing operations performed by the storage node may be performed by the controller, to combine, into the second check matrix, the data units and the check units in the w first check matrices included in the data in the first medium layer, to be written in the second medium layer. Details are not described again in this embodiment of this application.

After data is stored according to the foregoing data storage method, when a node included in the first medium layer or a hard disk included in the second medium layer is faulty, if the data is stored in the second medium layer, that is, the second check matrix is generated, data units and a check unit at a location other than a faulty point are read from the second medium layer based on a quantity of faulty points, a faulty location, and a distribution location of each unit in the second check matrix, to perform reconstruction, to recover data in the faulty point. Optionally, if data is stored in the first medium layer but not stored in the second medium layer, data units and a check unit at an unfaulty location are read from the first medium layer based on a quantity of faulty points, a faulty location, and a distribution location of each unit in each first check matrix, to perform reconstruction, to recover data in the faulty point in the first medium layer.

In this embodiment of this application, a quantity of data units corresponding to the first erasure code ratio is less than a quantity of data units corresponding to the second erasure code ratio, in other words, the first erasure code ratio is a ratio of a small proportion, and the second erasure code ratio is a ratio of a large proportion. On this basis, data is cached in the first medium layer based on the first erasure code ratio, data is stored in the second medium layer based on the second erasure code ratio, and performance of the first medium layer is higher than performance of the second medium layer. That is, data is stored in a high-performance medium layer by using a relatively small erasure code ratio, and data is stored in a low-performance medium layer by using a relatively large erasure code ratio. Because a granularity of an I/O request received by the high-performance medium layer is relatively small, when the high-performance medium layer stores data by using a relatively small erasure code ratio, each time a size of received data reaches a size of N data units corresponding to the erasure code ratio, one complete stripe (N data units and M check units can form one stripe) can be obtained. It is easier to obtain a complete stripe based on the small erasure code ratio than a relatively large erasure code ratio, so that an amount of zero-fill data in the stripe is reduced, thereby alleviating write amplification, and improving storage space utilization. For example, in the high-performance medium layer, compared with storing data by using 24:2, when data is stored by using an erasure code ratio 6:2, it is easier to completely obtain six data units than 24 data units in a specified time period based on a received small-granularity I/O request. In this way, it is unnecessary to perform zero-filling when the 24 data units cannot be completely obtained, that is, an amount of zero-fill data in a stripe is reduced, thereby reducing a proportion of redundant data in the stripe, alleviating write amplification, and improving storage space utilization. In addition, a proportion of redundant data in storage space can be reduced by using a relatively large erasure code ratio to store data in the low-performance medium layer, thereby improving storage space utilization.

In addition, in this embodiment of this application, one piece of data cached in the first medium layer based on the first erasure code ratio can be directly converted into one piece of data that complies with the second erasure code ratio, to be stored in the second medium layer, so that data storage reliability is improved while storage space utilization of the storage system is improved. In addition, in the foregoing conversion process, the data units in the plurality of first stripes no longer need to participate in an operation, thereby saving a computing resource of the storage system.

The foregoing embodiment mainly provides the following description: When the quantity of data units that are in the plurality of first stripes complying with the first erasure code ratio and that are cached in the first medium layer reaches the quantity of data units in the second stripe that complies with the second erasure code ratio, that is, when a complete second stripe can be obtained by using the plurality of first stripes cached in the first medium layer, the data units of the plurality of first stripes and the check units of the second stripe are stored in the second medium layer.

In another embodiment of the present invention, to improve data storage reliability, the first stripe that complies with the first erasure code ratio may be persistently stored in the storage system, that is, stored in the second medium layer. In this way, data reliability can be improved, to prevent data in a non-persistently-stored first stripe in the first medium layer from being lost because the storage system is faulty. When a complete second stripe can be obtained by using the non-persistently-stored first stripe and a persistently-stored first stripe in the first medium layer, that is, when a sum of a quantity of data units in the non-persistently-stored first stripe and a quantity of data units in the persistently-stored first stripe in the first medium layer is equal to the quantity of data units in the second stripe, a check unit in the persistently-stored first stripe is read, and a check unit in the non-persistently-stored first stripe in the first medium layer is read, to generate a check unit of the second stripe. For a specific implementation, refer to the description in the foregoing embodiment. Details are not described again in this embodiment of the present invention. Data units of the non-persistently-stored first stripe and the check unit of the second stripe are persistently stored in the second medium layer, to achieve persistent storage of the second stripe in the storage system.

In the foregoing embodiment of the present invention, in another implementation, the stripe management method may be implemented by an interface card in the storage system, for example, implemented by a host bus adapter (HBA), a network interface card (NIC), or an expander. Details are not described in the present invention.

The following describes a stripe management apparatus provided in the embodiments of this application.

Figure 11:
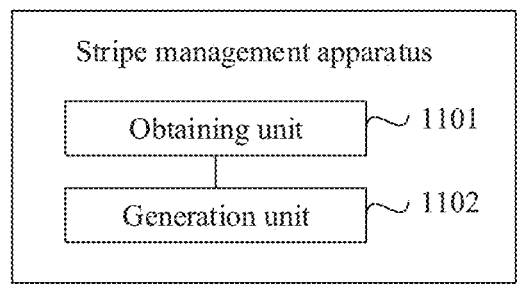
FIG. 11 is a schematic diagram of a structure of a stripe management apparatus according to an embodiment of this application.

Referring to FIG. 11, an embodiment of this application provides a stripe management apparatus. The stripe management apparatus is applied to any storage node in the foregoing described storage system shown in FIG. 1 or FIG. 2, or may be applied to the storage array shown in FIG. 3, or the like. The stripe management apparatus includes:

an obtaining unit 1101, configured to obtain check units in a plurality of first stripes, where the first stripe complies with a first erasure code ratio; and a generation unit 1102, configured to generate a new check unit based on the check units in the plurality of first stripes, where the new check unit and data units in the plurality of first stripes belong to a new stripe, the new stripe complies with a second erasure code ratio, and a quantity of data units corresponding to the first erasure code ratio is less than a quantity of data units corresponding to the second erasure code ratio. In this embodiment of the present invention, for implementation of the foregoing units, refer to the description in the foregoing embodiment of the present invention.

Optionally, a quantity of check units in the new stripe is the same as a quantity of check units in the first stripe.

Optionally, the plurality of first stripes include at least one first stripe that is not persistently stored in the storage system and at least one first stripe that is persistently stored in the storage system; and the obtaining unit 1101 is specifically configured to:

read a check unit in the at least one first stripe that is persistently stored in the storage system; and read a check unit in the at least one first stripe that is not persistently stored in the storage system.

Further, the stripe management apparatus further includes a storage unit 1103, and the storage unit 1103 is configured to persistently store data units in the at least one first stripe that is not persistently stored in the storage system and the new check unit.

Optionally, the plurality of first stripes are first stripes that are not persistently stored in the storage system, the stripe management apparatus further includes a storage unit 1103, and the storage unit 1103 is configured to persistently store the data units in the plurality of first stripes and the new check unit.

In conclusion, in this embodiment of this application, performance of a first medium layer is different from performance of a second medium layer. On this basis, data is stored in the first medium layer and the second medium layer based on different erasure code ratios. Different erasure code ratios correspond to different write amplification, and therefore cause different storage space utilization. Therefore, different erasure code ratios are selected based on different performance of the medium layers to store data, so that storage performance of a corresponding medium layer can be better exerted, thereby effectively improving storage space utilization.

It should be noted that, when the stripe management apparatus provided in the foregoing embodiment performs data storage, only divisions of the foregoing functional modules are used as an example for description. In actual application, the foregoing functions may be allocated to and completed by different functional modules based on a requirement. In other words, an internal structure of a device is divided into different functional modules, to complete all or some of the functions described above. In addition, the stripe management apparatus provided in the foregoing embodiment and the embodiment of the stripe management method belong to a same concept. For a specific implementation process thereof, refer to the method embodiment. Details are not described herein again.

All or some of the foregoing embodiments may be implemented by software, hardware, firmware, or any combination thereof. When software is used to implement the embodiments, all or some of the embodiments may be implemented in a form of a computer program product. The computer program product includes one or more computer program instructions. When the computer program instructions are loaded and executed on a computer, all or some of the procedures or the functions according to embodiments of this application are generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by the computer, or a data storage device, for example, a server or a data center, integrating one or more usable media. The usable medium may be a magnetic medium (for example, a floppy disk, a hard disk, or a magnetic tape), an optical medium (for example, a digital versatile disc (DVD)), a semiconductor medium (for example, a solid state disk (SSD)), or the like.

A person of ordinary skill in the art may understand that all or some of the steps of embodiments may be implemented by hardware or a program instructing related hardware. The program may be stored in a computer-readable storage medium. The storage medium may be a read-only memory, a magnetic disk, or an optical disc.

It should be understood that "at least one" mentioned in this specification means one or more, and "a plurality of" means two or more. In description of this application, "/" means "or" unless otherwise specified. For example, AB may represent A or B. In this specification, "and/or" describes only an association relationship for describing associated objects and represents that three relationships may exist. For example, A and/or B may represent the following three cases: Only A exists, both A and B exist, and only B exists. In addition, for convenience of clear description in the embodiments of this application, terms such as "first", "second", and the like are used to distinguish between same objects or similar objects whose functions and purposes are basically the same. A person skilled in the art may understand that the terms such as "first" and "second" do not limit a quantity and an execution sequence, and the terms such as "first" and "second" do not indicate a definite difference.

What is claimed is:

1. A stripe management method, applied to a storage system, wherein the method comprises:
   obtaining check units in a plurality of stripes, wherein a first stripe of the plurality of stripes complies with a first erasure code ratio corresponding to a first storage media; and
   generating at least one new check unit based on the check units in the plurality of stripes, wherein the at least one new check unit and data units in the plurality of stripes belong to a new stripe, the new stripe complies with a second erasure code ratio corresponding to a second storage media having a different type than the first storage media, and a quantity of data units corresponding to the first erasure code ratio is less than a quantity of data units corresponding to the second erasure code ratio.

2. The method according to claim 1, wherein a quantity of check units in the new stripe is same as a quantity of check units in the first stripe.

3. The method according to claim 1, wherein the plurality of stripes comprise at least one stripe that is not persistently stored in the storage system and at least one stripe that is persistently stored in the storage system, and wherein obtaining the check units in the plurality of stripes comprises:
   reading a check unit in the at least one stripe that is persistently stored in the storage system; and
   reading a check unit in the at least one stripe that is not persistently stored in the storage system.

4. The method according to claim 3, wherein the method further comprises:
   persistently storing data units in the at least one stripe that is not persistently stored in the storage system and the at least one new check unit.

5. The method according to claim 1, wherein the plurality of stripes are not persistently stored in the storage system, and wherein the method further comprises:
   persistently storing the data units in the plurality of stripes and the at least one new check unit.

6. The method according to claim 1, wherein performance of the first storage media is higher than performance of the second storage media.

7. A storage system, wherein the storage system comprises:
   one or more processors; and
   one or more memories coupled to the one or more processors and storing programming instructions for execution by the one or more processors to:
   obtain check units in a plurality of stripes, wherein a first stripe of the plurality of stripes complies with a first erasure code ratio corresponding to a first storage media; and
   generate at least one new check unit based on the check units in the plurality of stripes, wherein the at least one new check unit and data units in the plurality of stripes belong to a new stripe, the new stripe complies with a second erasure code ratio corresponding to a second storage media having a different type than the first storage media, and a quantity of data units corresponding to the first erasure code ratio is less than a quantity of data units corresponding to the second erasure code ratio.

8. The storage system according to claim 7, wherein a quantity of check units in the new stripe is same as a quantity of check units in the first stripe.

9. The storage system according to claim 7, wherein the plurality of stripes comprise at least one stripe that is not persistently stored in the storage system and at least one stripe that is persistently stored in the storage system, and wherein the programming instructions are for execution by the one or more processors to:
   read a check unit in the at least one stripe that is persistently stored in the storage system; and
   read a check unit in the at least one stripe that is not persistently stored in the storage system.

10. The storage system according to claim 9, wherein the programming instructions are for execution by the one or more processors to:
    persistently store data units in the at least one stripe that is not persistently stored in the storage system and the at least one new check unit.

11. The storage system according to claim 7, wherein the plurality of stripes are not persistently stored in the storage system, and wherein the programming instructions are for execution by the one or more processors to:
    persistently store the data units in the plurality of stripes and the at least one new check unit.

12. The storage system according to claim 7, wherein performance of the first storage media is higher than performance of the second storage media.

13. A non-transitory computer-readable storage medium, wherein the non-transitory computer-readable storage medium comprises computer program instructions for execution by one or more processors in a storage system, and the computer program instructions, when executed by the one or more processors, enable the storage system to:
    obtain check units in a plurality of stripes, wherein a first stripe of the plurality of stripes complies with a first erasure code ratio corresponding to a first storage media; and
    generate at least one new check unit based on the check units in the plurality of stripes, wherein the at least one new check unit and data units in the plurality of stripes belong to a new stripe, the new stripe complies with a second erasure code ratio corresponding to a second storage media having a different type than the first storage media, and a quantity of data units corresponding to the first erasure code ratio is less than a quantity of data units corresponding to the second erasure code ratio.

14. The non-transitory computer-readable storage medium according to claim 13, wherein a quantity of check units in the new stripe is same as a quantity of check units in the first stripe.

15. The non-transitory computer-readable storage medium according to claim 13, wherein the plurality of stripes comprise at least one stripe that is not persistently stored in the storage system and at least one stripe that is persistently stored in the storage system, and wherein obtaining the check units in the plurality of stripes comprises:
    reading a check unit in the at least one stripe that is persistently stored in the storage system; and
    reading a check unit in the at least one stripe that is not persistently stored in the storage system.

16. The non-transitory computer-readable storage medium according to claim 15, wherein the computer program instructions, when executed by the one or more processors, enable the storage system to further:

persistently store data units in the at least one stripe that is not persistently stored in the storage system and the at least one new check unit.

17. The non-transitory computer-readable storage medium according to claim 13, wherein the plurality of stripes are not persistently stored in the storage system, and wherein the computer program instructions, when executed by the one or more processors, enable the storage system to further:
   persistently store the data units in the plurality of stripes and the at least one new check unit.

18. The non-transitory computer-readable storage medium according to claim 13, wherein performance of the first storage media is higher than performance of the second storage media.

* * * * *